US012560629B2

(12) United States Patent (10) Patent No.: US 12,560,629 B2
Yamada et al. (45) Date of Patent: Feb. 24, 2026

(54) METHOD OF MANUFACTURING CONTACT PROBE AND CONTACT PROBE

(71) Applicant: NHK Spring Co., Ltd., Yokohama (JP)

(72) Inventors: Yoshio Yamada, Tokyo (JP); Shuji Takahashi, Tokyo (JP); Jun Kinoshita, Tokyo (JP)

(73) Assignee: NHK Spring Co., Ltd., Yokohama (JP)

( * ) Notice: Subject to any disclaimer, the term of this patent is extended or adjusted under 35 U.S.C. 154(b) by 136 days.

(21) Appl. No.: 18/432,205

(22) Filed: Feb. 5, 2024

(65) Prior Publication Data

US 2024/0272201 A1      Aug. 15, 2024

(30) Foreign Application Priority Data

Feb. 9, 2023    (JP) ................................. 2023-018596

(51) Int. Cl.
G01R 3/00           (2006.01)
G01R 1/067          (2006.01)
(52) U.S. Cl.
CPC ........... G01R 3/00 (2013.01); G01R 1/06722 (2013.01)
(58) Field of Classification Search
CPC ...... G01R 3/00; G01R 1/06722; G01R 1/067; G01R 1/06716
USPC ............. 324/754.03, 754.14, 755.01, 755.05
See application file for complete search history.

(56) References Cited

U.S. PATENT DOCUMENTS 6,677,772 B1 * 1/2004 Faull .................. G01R 1/06722
                                                   324/755.05
9,784,764 B2 * 10/2017 Tanaka ..................... G01R 3/00

2008/0088331 A1    4/2008  Yoshida
2018/0010771 A1 *  1/2018  Tatsuno ................ F21V 7/0066
2018/0013217 A1 *  1/2018  Kuroda ................ H01R 13/415
2020/0393507 A1   12/2020  Suzuki et al.
2021/0072284 A1    3/2021  Suzuki et al.

FOREIGN PATENT DOCUMENTS

JP        2008-070146 A      3/2008
JP        2008-253501 A     10/2008
JP        2019-061871 A      4/2019
(Continued)

OTHER PUBLICATIONS

Office Action mailed Feb. 4, 2025, issued for JP2023-018596 and English translation thereof.

(Continued)

*Primary Examiner* — Roberto Velez

(74) *Attorney, Agent, or Firm* — Troutman Pepper Locke LLP

(57)                    ABSTRACT

A method of manufacturing a contact probe includes: forming external shapes of a plurality of main body part base materials on a plate material, each of the plurality of main body part base materials being connected to a base part via a connection part and used for forming a main body part of a pipe member; forming a plurality of protrusions on each of the plurality of main body part base materials; forming the pipe member by bending each of the plurality of main body part base materials into a C-shape such that the protrusions protrude toward an inner side of the pipe member; assembling the contact probe by inserting first and second plungers and a coil spring into the pipe member connected to the connection part; and cutting the pipe member from the connection part.

4 Claims, 9 Drawing Sheets

(56)          References Cited

FOREIGN PATENT DOCUMENTS

| | | | |
|---|---|---|---|
| JP | 2019-138658 | A | 8/2019 |
| JP | 6751249 | B1 | 9/2020 |
| JP | 2020-161472 | A | 10/2020 |
| JP | 2021042974 | A | 3/2021 |

OTHER PUBLICATIONS

Office Action mailed Jun. 3, 2025, issued for JP2023-018596 and English translation thereof.
Decision to Grant mailed Aug. 5, 2025, issued for JP2023-018596 and English translation thereof.

* cited by examiner

FIG.1

START

OUTER PERIPHERY PUNCHING STEP ⟋∽S101

PROTRUSION FORMING STEP ⟋∽S102

CURLING STEP ⟋∽S103

PROBE ASSEMBLY STEP ⟋∽S104

CONNECTION PART CUTTING STEP ⟋∽S105

END

METHOD OF MANUFACTURING CONTACT PROBE AND CONTACT PROBE

This application is based upon and claims the benefit of priority of the prior Japanese Patent Application No. 2023-018596, filed on Feb. 9, 2023, the entire contents of which are incorporated herein by reference.

BACKGROUND

The present disclosure relates to a method of manufacturing a contact probe and a contact probe.

In the related art, when performing a conduction state test and an operating characteristics test of a test target such as a semiconductor integrated circuit and a liquid crystal display device, conductive contact probes for enabling electrical connection between the test target and a signal processing device with a circuit board that outputs test signals are used (for example, see Japanese Patent No. 6751249). In Japanese Patent No. 6751249, a plate member is bent and formed into a cylindrical shape, and two plungers and a coil spring are inserted into the formed pipe member to make a contact probe.

SUMMARY

As in Japanese Patent No. 6751249, the plate member connected via a connection part is bent and, thereafter, each pipe member is separated from the connection part, and the plungers and coil spring are inserted. This complicates the processing and lowers work efficiency. Especially in the assembly of small-sized members such as contact probes, work efficiency is more reduced.

There is a need for a method of manufacturing a contact probe capable of efficiently manufacturing a contact probe.

According to one aspect of the present disclosure, there is provided a method of manufacturing a contact probe, the contact probe being configured to transmit a signal with both ends in a longitudinal direction coming in contact with electrodes different from each other, and including: a first plunger that comes in contact with one of the electrodes; a second plunger that comes in contact with another one of the electrodes; a coil spring provided between the first and the second plungers; and a pipe member where the first and the second plungers and the coil spring are inserted, the method including: an external shape forming step of forming external shapes of a plurality of main body part base materials on a plate material, each of the plurality of main body part base materials being connected to a base part via a connection part and used for forming a main body part of the pipe member; a protrusion forming step of forming a plurality of protrusions on each of the plurality of main body part base materials; a curling step of forming the pipe member by bending each of the plurality of main body part base materials into a C-shape such that the protrusions protrude toward an inner side of the pipe member; a probe assembling step of assembling the contact probe by inserting the first and the second plungers and the coil spring into the pipe member connected to the connection part; and a cutting step of cutting the pipe member from the connection part.

According to another aspect of the present disclosure, there is provided a contact probe for transmitting a signal with both ends in a longitudinal direction coming in contact with electrodes different from each other, the contact probe including: a first plunger including a first tip part coming in contact with one of the electrodes, and a first flange part connected to the first tip part; a second plunger including a second tip part coming in contact with another one of the electrodes, and a second flange part connected to the second tip part; a coil spring provided between the first and the second plungers; and a pipe member where the first and the second plungers and the coil spring are inserted, wherein the pipe member includes a main body part formed by bending a plate member into a C-shape, and the main body part includes: a plurality of first protrusions where the first flange part is locked, the first protrusions being formed by protruding toward an inner side; and a plurality of second protrusions where the second flange part is locked, the second protrusions being formed by protruding toward the inner side.

BRIEF DESCRIPTION OF THE DRAWINGS

FIG. 1 is a perspective view illustrating a configuration of a probe unit according to an embodiment;

DETAILED DESCRIPTION

Figure 2:
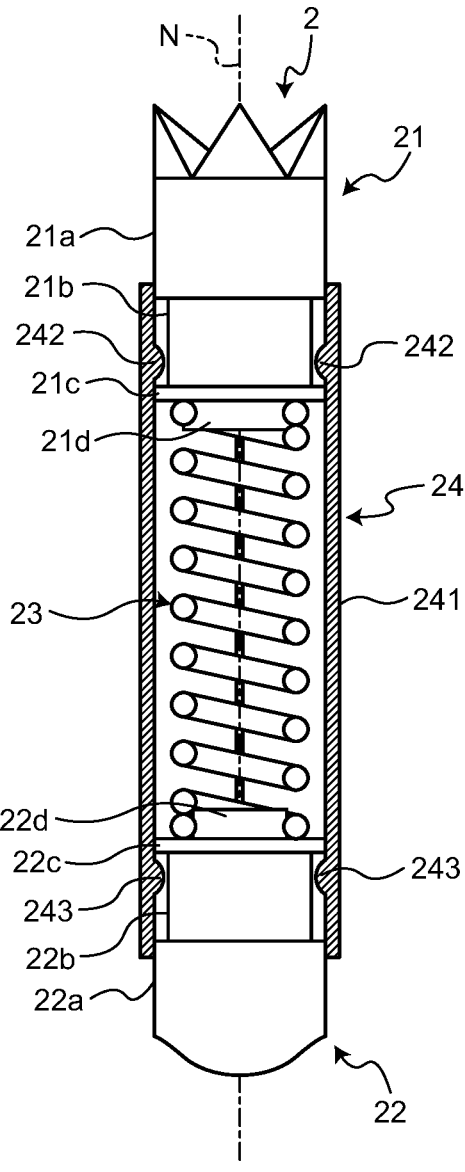
FIG. 2 is a fragmentary sectional view illustrating a configuration of a contact probe according to the embodiment.

Hereinafter, modes for embodying the present disclosure will be described in detail with reference to the accompanying drawings. Note that the present disclosure is not limited by the following embodiments. In addition, each of the drawings referred to in the following description is only a schematic representation of the shape, size, and positional relationship to the extent that the contents of the present disclosure can be understood, and therefore, the present disclosure is not limited only to the shape, size, and positional relationship illustrated in each of the drawings.

Figure 1:
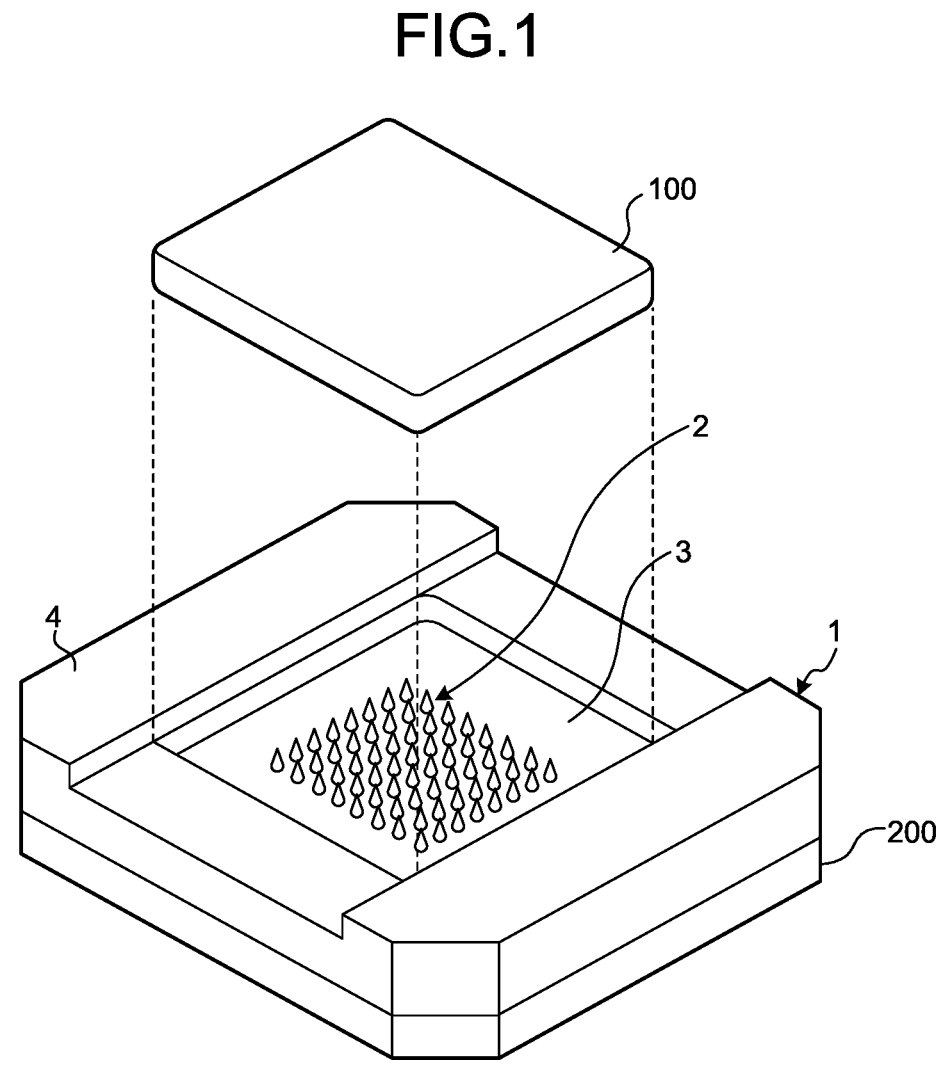

FIG. 1 is a perspective view illustrating a configuration of a probe unit according to an embodiment. A probe unit 1 illustrated in FIG. 1 is a device used to perform electrical characteristics tests of a semiconductor integrated circuit 100 that is a test target, and it is a device for electrically connecting the semiconductor integrated circuit 100 and a circuit board 200 that outputs test signals to the semiconductor integrated circuit 100.

The probe unit 1 includes: a plurality of conductive contact probes 2 (hereinafter, simply referred to as "probe(s) 2"), each of which comes in contact with electrodes of the semiconductor integrated circuit 100 and the circuit board 200 that are two contacted bodies different from each other at both ends in the longitudinal direction; a probe holder 3 that houses and holds the plurality of probes 2 in accordance with a prescribed pattern; and a holder member 4 that is provided around the probe holder 3 and suppresses misalignment of the semiconductor integrated circuit 100 that comes in contact with the probes 2 during a test.

FIG. 2 is a fragmentary sectional view illustrating a configuration of the probe according to the embodiment. The probe 2 is formed using a conductive material, and includes: a first plunger 21 that comes in contact with an electrode of the semiconductor integrated circuit 100 when performing a test of the semiconductor integrated circuit 100; a second plunger 22 that comes in contact with an electrode of the circuit board 200 that is provided with a test circuit; a coil spring 23 that is provided between the first plunger 21 and the second plunger 22 and energizes the first plunger 21 and the second plunger 22 in directions separating from each other; and a pipe member 24 that holds the first plunger 21 and the second plunger 22 in a freely advanceable/retreatable manner, and also houses the coil spring 23. In FIG. 2, the first plunger 21, the second plunger 22, and the coil spring 23 that configure the probe 2 have the same axial line. In other words, the center axes of the first plunger 21, the second plunger 22, and the coil spring 23 are on the same axis (longitudinal axis) N. Note that "same axial line" includes deviations due to distortion of individual components, manufacturing errors, and the like. When the semiconductor integrated circuit 100 is brought into contact with the probe 2, the coil spring 23 expands and contracts in the axial direction to soften the impact on the electrode of the semiconductor integrated circuit 100 and apply load to the semiconductor integrated circuit 100 and the circuit board 200.

The first plunger 21 includes: a tapered-shaped tip part 21a that comes in contact with the electrode of the semiconductor integrated circuit 100; a reduced-diameter part 21b that is connected to the base end side of the tip part 21a and has a smaller diameter than the diameter of the tip part 21a; a flange part 21c that extends to the opposite side of the tip part 21a through the reduced-diameter part 21b and has a larger diameter than the diameter of the reduced-diameter part 21b; and a boss part 21d that has a smaller diameter than the flange part 21c and into which one end part of the coil spring 23 is inserted. The first plunger 21 can move in the axial direction by the expansion and contraction actions of the coil spring 23. Hereinafter, the semiconductor integrated circuit 100 side of the first plunger 21 is referred to as "tip side", and the opposite of the tip side of the first plunger 21 in the longitudinal axis N direction is referred to as "base end side".

The second plunger 22 includes: a tapered-shaped tip part 22a that comes in contact with the electrode of the circuit board 200; a reduced-diameter part 22b that is connected to the base end side of the tip part 22a and has a smaller diameter than the diameter of the tip part 22a; a flange part 22c that extends to the opposite side of the tip part 22a through the reduced-diameter part 22b and has a larger diameter than the diameter of the reduced-diameter part 22b; and a boss part 22d that extends to the opposite side of the reduced-diameter part 22b through the flange part 22c, has a smaller diameter than the flange part 22c, and into which the other end part of the coil spring 23 is inserted. The second plunger 22 can move in the axial direction by the expansion and contraction actions of the coil spring 23, and it is energized toward the direction of the circuit board 200 by the elastic force of the coil spring 23, thereby coming in contact with the electrode of the circuit board 200.

While the tip part 21a is described in the present embodiment as having a crown shape with a plurality of claws at the tip, it may also have other shapes such as a cone shape, a spherical shape, and the like. Similarly, while the tip part 22a is described as having a cone-shaped tip, it may also have other shapes such as a crown shape with a plurality of claws, a spherical shape, and the like.

Furthermore, while the tip part 21a and the flange part 21c as well as the tip part 22a and the flange part 22c are described in the present embodiment to have the same diameter, they may also be formed to have different diameters from each other.

The coil spring 23 is formed with a wire material wound at a prescribed pitch. For example, the coil spring 23 is formed by winding a single conductive wire. Furthermore, the coil spring 23 applies load to the first plunger 21 and the second plunger 22 in the directions separating from each other with respect to the axis N direction.

The pipe member 24 is formed by bending a plate member, and it has a cylindrical main body part 241 with part of the circumferential direction thereof being opened. Therefore, the shape of the pipe member 24 viewed from the longitudinal axial direction (through direction) forms a C-shape. Furthermore, in the main body part 241, a plurality of protrusions 242 and 243 protruding toward the inner side are formed. The protrusions 242 and 243 are formed by concaving the main body part 241 toward the inner periphery side. The protrusions 242 are formed on one end side of the pipe member 24. Furthermore, the protrusions 243 are formed on the other end side of the pipe member 24.

The flange part 21c of the first plunger 21 has a stopper function for preventing the probe 2 from coming off from the probe holder 3 by abutting against the protrusions 242 of the pipe member 24. The flange part 22c of the second plunger 22 also has a stopper function for preventing the probe 2 from coming off from the probe holder 3 by abutting against the protrusions 243 of the pipe member 24. At this time, the protrusions 242 are located in the reduced-diameter part 21b, and movement thereof toward the second plunger 22 side is restricted by the step formed by the tip part 21a and the reduced-diameter part 21b. Similarly, movement of the protrusions 243 toward the first plunger 21 side is restricted by the step formed by the tip part 22a and the reduced-diameter part 22b. While the protrusions 242 and 243 are described in the present embodiment by referring to an example where four each are disposed along the circumferential direction, for example, the number and arrangement of the protrusions are not limited thereto, as long as it is possible to acquire the stopper effect by locking to the flange part.

The probe holder 3 is formed using an insulating material such as resin, machinable ceramic, or silicon. The probe holder 3 has holder holes for housing the probes 2. The forming positions of the holder holes are determined in accordance with the wiring pattern of the semiconductor integrated circuit 100.

During a test of the semiconductor integrated circuit 100, the coil spring 23 is in a compressed state along the longitudinal direction due to the contact load from the semiconductor integrated circuit 100 and the circuit board 200. A test signal supplied from the circuit board 200 to the semiconductor integrated circuit 100 during the test reaches a connection electrode of the semiconductor integrated circuit 100 from the electrode of the circuit board 200 via the second plunger 22, the pipe member 24 (or the coil spring 23), and the first plunger 21 of the probe 2.

Figure 3:
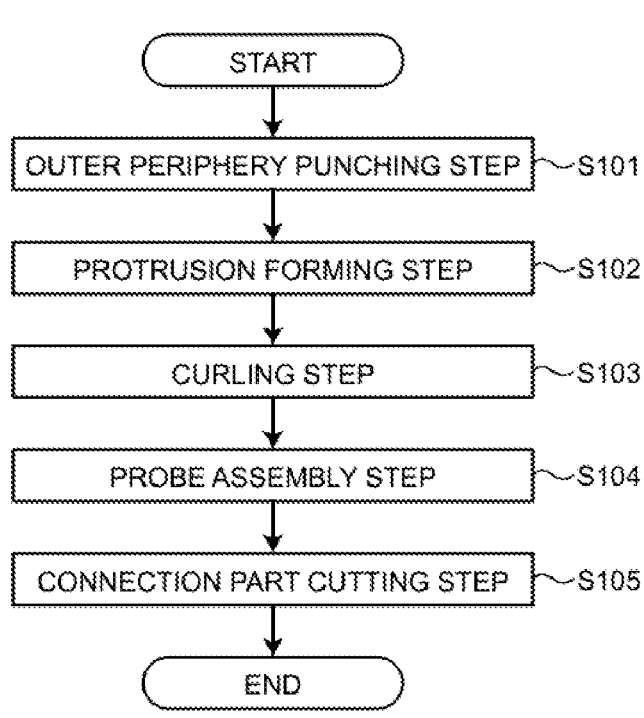
FIG. 3 is a flowchart for describing a method of manufacturing a contact probe according to the embodiment.
Figure 4:
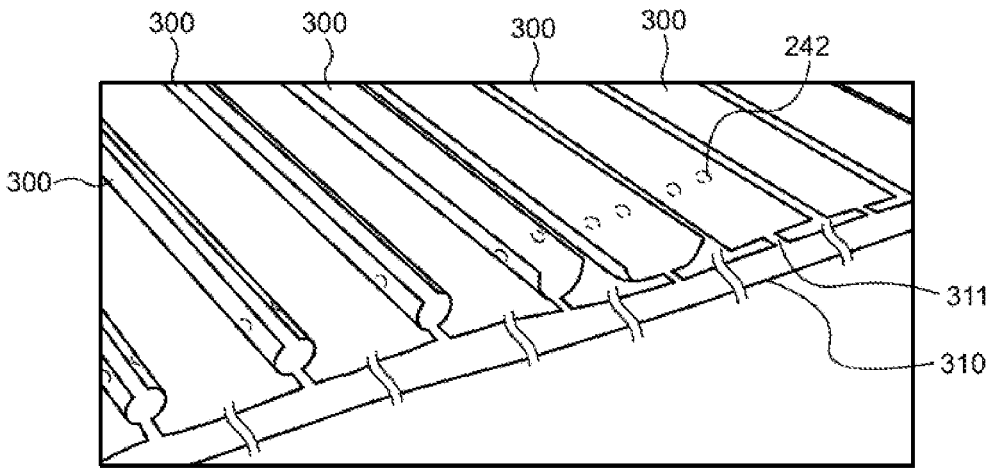
FIG. 4 is a perspective view for describing a state of a base material at the time of manufacturing.
Figure 5:
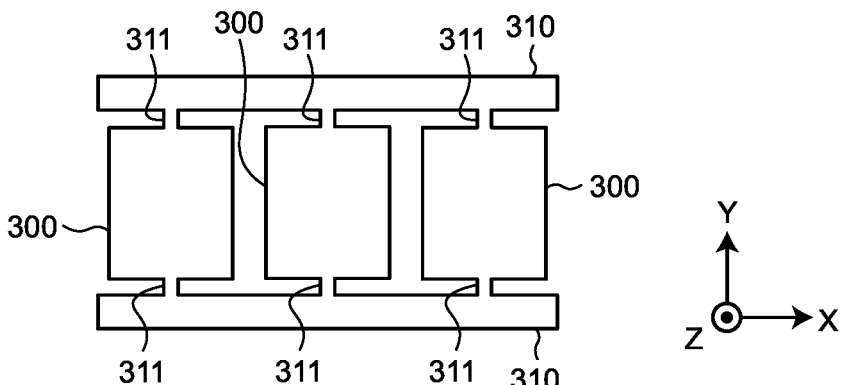
FIG. 5 is a diagram (part 1) for describing the method of manufacturing a contact probe according to the embodiment.

Subsequently, a manufacturing method of the probe 2 will be described by referring to FIG. 3 to FIG. 10. FIG. 3 is a flowchart for describing a method of manufacturing a contact probe according to the embodiment. FIG. 4 is a perspective view for describing a state of the pipe member at the time of manufacturing. FIG. 5 to FIG. 9 are diagrams for describing the method of manufacturing a contact probe according to the embodiment. FIG. 10 is a fragmentary sectional view taken along A-A line illustrated in FIG. 9. In FIG. 4, the state of the pipe member in each step is illustrated in order from the right side of the drawing. Furthermore, FIG. 7 illustrates a cross-section of the protrusion 242 of FIG. 6 cut in a plane with an XZ plane as the cutting plane.

In probe fabrication processing, first, a plate material is punched to form an external shape of a main body part base material 300 to be the main body part 241 of the pipe member 24 (step S101: outer periphery punching step (external shape forming step)). At this time, a plurality of main body part base materials 300 are formed to be in a state of being connected to each other. Specifically, the main body part base materials 300 are each connected to a base part 310 by respective connection parts 311 (see FIGS. 4 and 5). At this time, the connection part 311 is provided at one end side of the main body part base material 300 and at the opposite side end. Note that the connection part 311 may be provided only at one side, or the connection parts 311 may be provided at end parts on different sides between the main body part base materials 300 neighboring to each other in the arranged direction, as long as the base part 310 can support the main body part base materials 300.

Thereafter, part of the main body part base material 300 is concaved to form the protrusions (only the protrusions 242 are illustrated in FIG. 4) (step S102: stopper forming step (protrusion forming step)). In the present embodiment, four protrusions 242 are formed on one end side of the main body part base material 300, and four protrusions 243 are formed on the other end side (see FIGS. 6 and 7). In the stopper forming step, the protrusions 242 and 243 are formed with the same protruding direction with each other.

Figure 6:
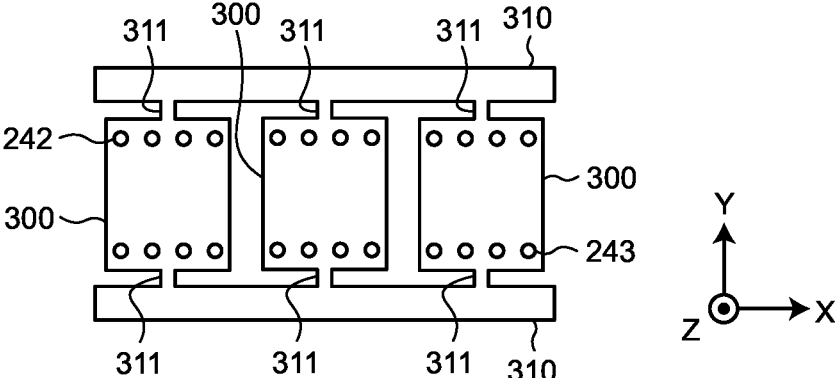
FIG. 6 is a diagram (part 2) for describing the method of manufacturing a contact probe according to the embodiment.
Figure 7:
FIG. 7 is a diagram (part 3) for describing the method of manufacturing a contact probe according to the embodiment.
Figure 8:
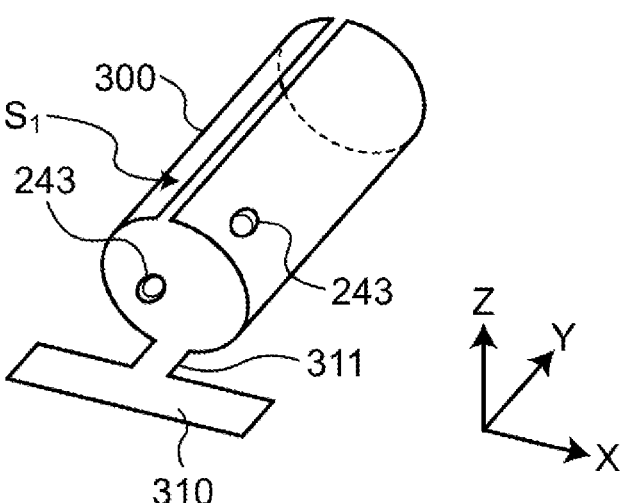
FIG. 8 is a diagram (part 4) for describing the method of manufacturing a contact probe according to the embodiment.

Note that the protrusions 242 and 243 may simply need to be in a shape that can be locked to the first plunger 21 and the second plunger 22 to prevent them from coming off, and may be in an oval shape, rectangular shape, trapezoidal shape, triangular shape, or the like other than the shape with a circular protrusion base end as illustrated in FIG. 6 and FIG. 7, for example.

Furthermore, step S102 may be performed before step S101.

Then, the main body part base material 300 is bent to form the main body part base material 300 into a cylindrical shape (step S103: curling step). At this time, bending is performed such that the faces on the protruding sides of the protrusions 242 and 243 come to be the inner face, and the shape viewed from the through direction of the cylinder forms a C-shape with the end parts in the circumferential direction being separated from each other by a prescribed distance. In the curling step, for example, the main body part base material 300 is sandwiched between a member with a concave face and a member with a convex face to bend the main body part base material 300 (see FIG. 8). Thereby, the main body part base material 300 is formed into a cylindrical shape, which corresponds to the main body part 241 to which the connection part 311 is connected. By the curling step, the main body part base material 300 has an opening part $S_1$ extending along the through direction formed in part of the circumferential direction. By forming the opening part $S_1$, the precision required for curling can be reduced compared to a case of forming a closed cylindrical shape with the end parts being abutted against each other.

When the cylindrical main body part base material 300 is formed at step S103, the first plunger 21, the second plunger 22, and the coil spring 23 are inserted into the main body part base material 300 to assemble the probe 2 (step S104: probe assembly step). At this time, each of the main body part base materials 300 is being connected to the connection part 311, and the first plunger 21, the second plunger 22, and the coil spring 23 are inserted into each of the main body part base material 300 while the main body part base materials 300 are connected to each other via the base part 310 (see FIGS. 9 and 10).

By forming the opening part $S_1$, the diameter of the main body part base material 300 can be easily expanded, thereby making it easy to insert the plungers at the time of insertion.

Figure 9:
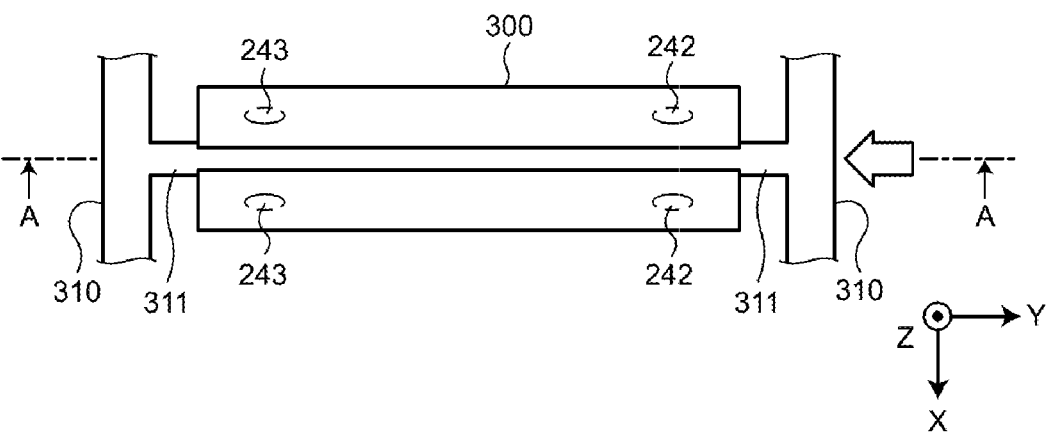
FIG. 9 is a diagram (part 5) for describing the method of manufacturing a contact probe according to the embodiment.
Figure 10:
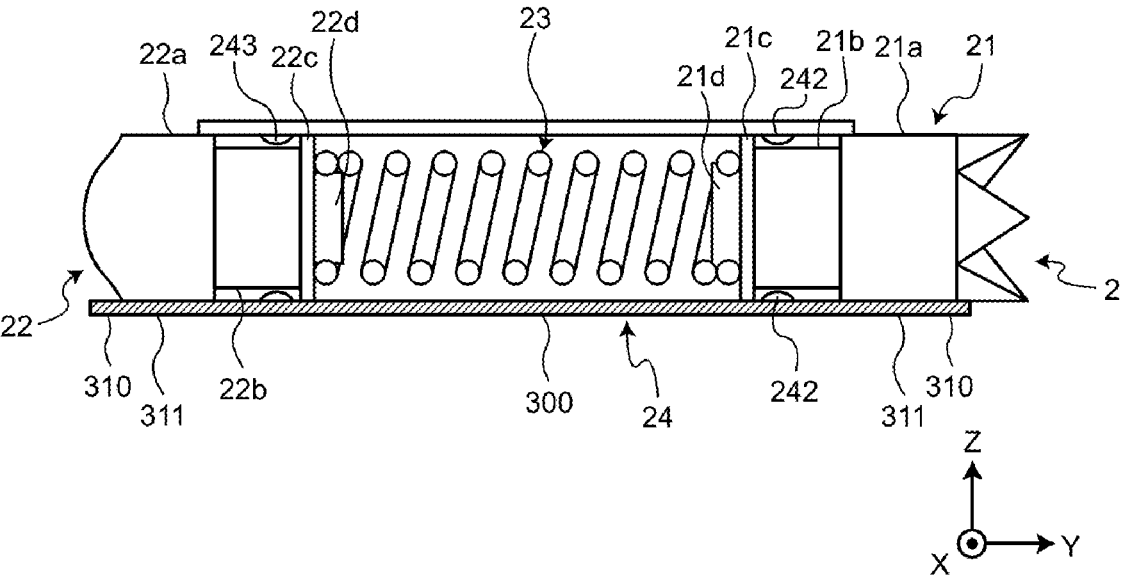
FIG. 10 is a fragmentary sectional view taken along A-A line illustrated in FIG. 9.

Furthermore, as illustrated in FIG. 9, while the present embodiment is described by referring to an example where the first plunger 21, the second plunger 22, and the coil spring 23 are inserted from the same direction (direction of an arrow illustrated in FIG. 9), those members may be inserted from the reverse direction, or part of the members may be inserted from a direction different from the other members. For example, the first plunger 21 may be inserted from the right direction in FIG. 9, and the second plunger 22 and the coil spring 23 may be inserted from the left direction in FIG. 9. Furthermore, one of the plungers may be designed to be locked to the protrusions and not to slide against the main body part base material 300 (pipe member 24). In this case, recessed parts to be locked to the protrusions may be formed in the plunger that is to be locked, for example.

Thereafter, by cutting each of the connection parts connecting the respective main body part base materials 300, the probes 2 each having the first plunger 21, the second plunger 22, the coil spring 23, and the pipe member 24 are fabricated (step S105: connection part cutting step).

The cutting method employed herein may be a cutting method using a laser and a cutting method by bending. From the viewpoint of suppressing burrs from forming in the cut area, it is preferable to employ laser cutting. With laser cutting, thermal effects on the plungers can also be avoided by adjusting the irradiation direction and the focal distance. At this time, if there is a gap between the main body part base material 300 and the plungers, a heat insulating material or the like may be provided in the gap. When the laser is used for cutting, a melting mark is formed in part of the end parts of the pipe member 24 on the sides from which the first plunger 21 and the second plunger 22 extend, respectively.

In the embodiment described above, the first plungers 21, the second plungers 22, and the coil springs 23 are assembled in a state where the main body part base materials 300 are being connected via the base part 310 and the connection parts 311, and the connection parts 311 are cut thereafter to fabricate the probes 2. According to the present embodiment, the first plunger 21, the second plunger 22, and the coil spring 23 are assembled in a state where the cylindrical main body part base material 300 is being regulated by the base part 310 (connection part 311), so that the plungers and the coil spring are assembled while suppressing the handling of the pipe member 24 (main body part base material 300) from becoming complicated. As a result, high work efficiency can be achieved.

Figure 11:
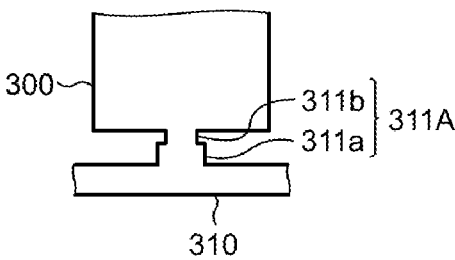
FIG. 11 is a diagram for describing a method of manufacturing a contact probe according to a first modification example.

Next, a first modification example of the present embodiment will be described by referring to FIG. 11. FIG. 11 is a diagram for describing a method of manufacturing a contact probe according to the first modification example. The first modification example is the same as the configuration of the embodiment described above, except that the structure of the connection part 311 according to the embodiment is changed. The same reference signs are applied for the same structural elements as those of the embodiment described above.

A connection part 311A according to the first modification example includes: a first connection part 311a extending from the base part 310; and a second connection part 311b that extends from the first connection part 311a on the opposite side of the base part 310, and connects to the main body part base material 300.

The length (width) of the first connection part 311a in the longitudinal direction of the base part 310 is greater than the length (width) of the second connection part 311b in the same direction. In other words, the connection part 311A on the main body part base material 300 side has a narrow stepped shape. Therefore, it is possible to reduce the load and time required for cutting the main body part base material 300 from the connection part 311A.

While the first modification example is described by referring to an example where the first connection part 311a and the second connection part 311b form a stepped shape, the connection area between the first connection part 311a and the second connection part 311b may form a tapered shape whose width continuously narrows toward the main body part base material 300, or the connection area may form an arc shape.

In the first modification example described above, as in the embodiment, the first plungers 21, the second plungers 22, and the coil springs 23 are assembled in a state where the main body part base materials 300 are being connected via the base part 310 and the connection parts 311A, and the connection parts 311 are cut thereafter to fabricate the probes 2 According to the first modification example, the first plunger 21, the second plunger 22, and the coil spring 23 are assembled in a state where the main body part base material 300 is being regulated by the base part 310 (connection part 311A), so that the plungers and the coil spring are assembled while suppressing the handling of the pipe member 24 (main body part base material 300) from becoming complicated. As a result, high work efficiency can be achieved.

Furthermore, since the connection part 311A is formed in a stepped shape that narrows toward the main body part base material 300 side in the first modification example, the strength of the connection part 311A in the cutting position becomes weaker than that of the shape of the connection part 311. Thus, the cutting processing can be performed with a smaller load or in a shorter time. The structure of the connection part 311A according to the first modification example is particularly effective when cutting is performed by bending.

Next, a second modification example of the present embodiment will be described by referring to FIG. 12 to FIG. 15. The second modification example further includes a coining step in contrast to the manufacturing method of the embodiment described above. Note that the same reference signs are applied for the same structural elements as those of the embodiment described above.

Figure 12:
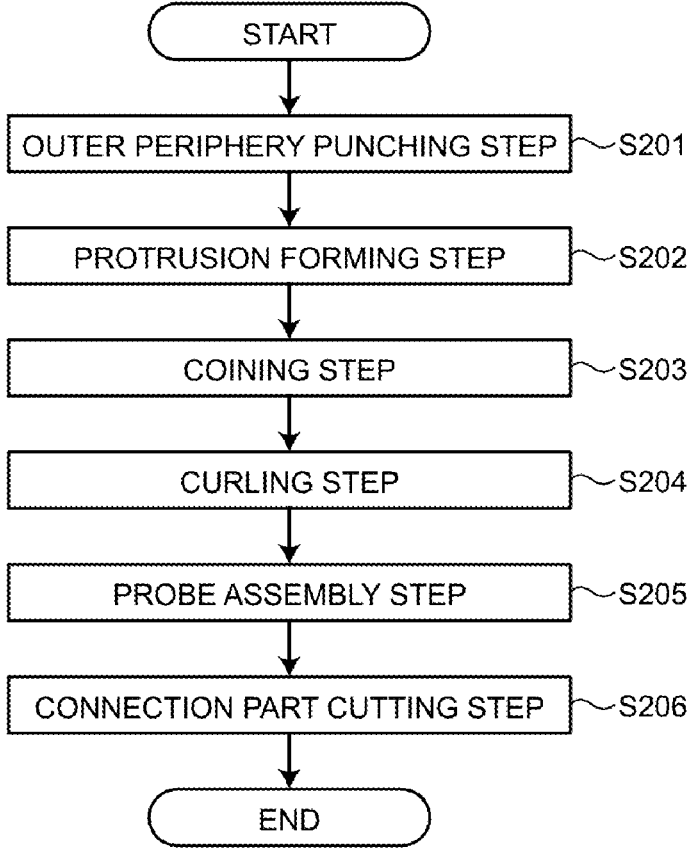
FIG. 12 is a flowchart for describing a method of manufacturing a contact probe according to a second modification example.

FIG. 12 is a flowchart for describing a method of manufacturing a contact probe according to the second modification example.

In the probe fabrication processing according to the second modification example, first, in the same manner as steps S101 and S102 indicated in FIG. 3, a plate material is punched to form the external shape of the main body part base material 300, and part of the main body part base material 300 is concaved to form the protrusions 242 and 243 (steps S201 and S202).

Figure 13:
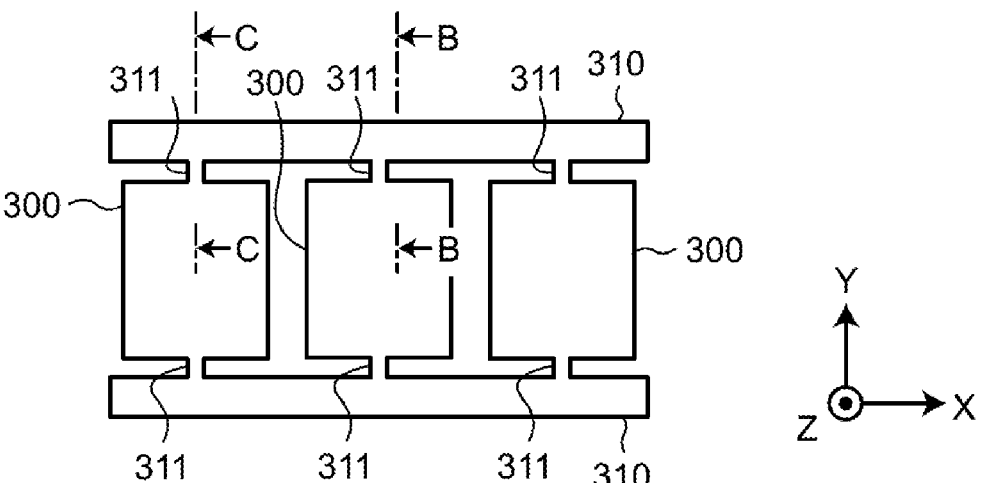
FIG. 13 is a diagram (part 1) for describing the method of manufacturing a contact probe according to the second modification example.
Figure 14:
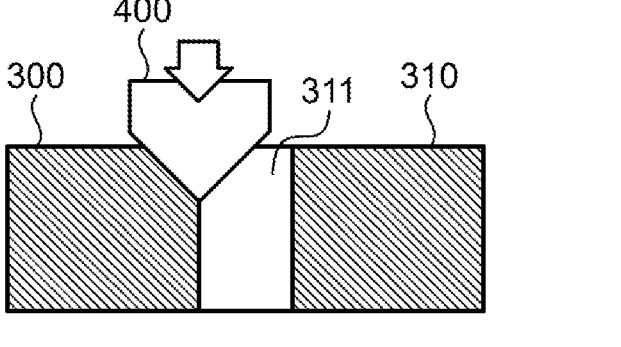
FIG. 14 is a diagram (part 2) for describing the method of manufacturing a contact probe according to the second modification example.
Figure 15:
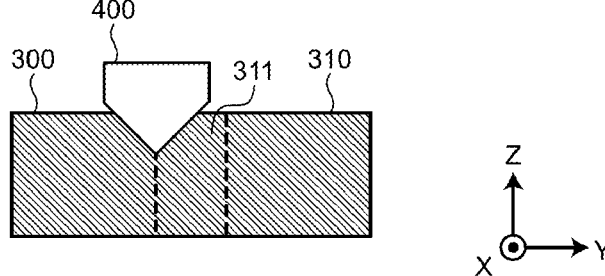
FIG. 15 is a diagram (part 3) for describing the method of manufacturing a contact probe according to the second modification example.

Thereafter, a coining step is performed to form the end parts of the main body part base material 300 (step S203). FIG. 13 to FIG. 15 are diagrams for describing the method of manufacturing a contact probe according to the second modification example. FIG. 14 is a sectional view taken along B-B line illustrated in FIG. 13. In the coining step, processing for smoothening the end face is applied to the end part of the main body part base material 300 on the side connecting to the connection part 311. For example, a die 400 is brought into contact with the area not connected to the connection part 311 to crush the end part.

Step S203 may be performed before step S202.

Note that coining may also be applied to the connecting area of the connection part 311 and the main body part base material 300. FIG. 15 is a sectional view taken along C-C line illustrated in FIG. 13. In the coining step, the connecting area between the main body part base material 300 and the connection part 311 is further concaved by the die 400. Thereby, the thickness of the connection area between the main body part base material 300 and the connection part 311 becomes thinner in the end part after cutting, which makes it easy to cut and suppress burrs from forming on the cut face (end face of the main body part 241).

After the coining step, in the same manner as step S103, the main body part base material 300 is bent to form the main body part base material 300 into a cylindrical shape (step S204: curling step). When the pipe member 24 is formed at step S204, in the same manner as step S104, the first plunger 21, the second plunger 22, and the coil spring 23 are inserted into the main body part base material 300 to assemble the probe 2 (step S205: probe assembly step). Thereafter, in the same manner as step S105, the probes 2 are fabricated by cutting the connection parts 311 that connect the respective main body part base materials 300 (step S206: connection part cutting step).

In the second modification example described above, as in the embodiment, the first plungers 21, the second plungers 22, and the coil springs 23 are assembled in a state where the main body part base materials 300 are being connected via the base part 310 and the connection parts 311, and the connection parts 311 are cut thereafter to fabricate the probes 2. According to the second modification example, the first plunger 21, the second plunger 22, and the coil spring 23 are assembled in a state where the main body part base material 300 is being regulated by the base part 310 (connection part 311), so that the plungers and the coil spring are assembled while suppressing the handling of the pipe member 24 (main body part base material 300) from becoming complicated. As a result, high work efficiency can be achieved.

Furthermore, with the second modification example, coining suppresses burrs from forming and smoothens the end face, thereby making it possible to improve the insertion property when inserting the plungers and the coil spring. In addition, with the smoother end face, the sliding property of the plungers against the pipe member 24 is improved.

When the coining step is performed for the purpose of achieving the above-described effects, it is sufficient to perform the coining step only on the end part of the main body part 241 on the insertion side of the plungers and the coil spring.

Figure 16:
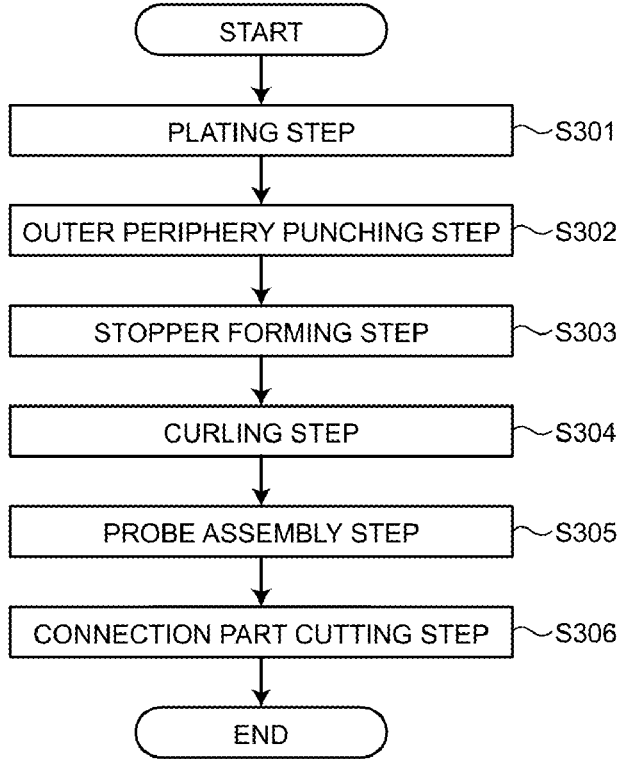
FIG. 16 is a flowchart for describing a method of manufacturing a contact probe according to a third modification example.

Next, a third modification example of the present embodiment will be described by referring to FIG. 16. The third modification example further includes a plating step in contrast to the manufacturing method of the embodiment described above. FIG. 16 is a flowchart for describing a method of manufacturing a contact probe according to the third modification example.

In the probe fabrication processing according to the third modification example, first, plating is applied to the material before the outer periphery punching step (step S301). For example, plating is applied to the entire surface of the material. Note that plating may be applied at least to a face corresponding to the inner peripheral face of the pipe member 24. As the plating, there is gold plating, for example.

Thereafter, in the same manner as steps S101 and S102 indicated in FIG. 3, a plate material is punched to form the external shape of the main body part base material 300, and part of the main body part base material 300 is concaved to form the protrusions 242 and 243 (steps S302 and S303). Then, in the same manner as step S103, the main body part base material 300 is bent to form the base material into a cylindrical shape (step S304: curling step). When the main body part base material 300 is formed at step S304, in the same manner as step S104, the first plunger 21, the second plunger 22, and the coil spring 23 are inserted into the main body part base material 300 to assemble the probe 2 (step S305: probe assembly step). Thereafter, in the same manner as step S105, the probes 2 are fabricated by cutting the connection parts 311 that connect the respective main body part base materials 300 (step S306: connection part cutting step).

In the third modification example described above, as in the embodiment, the first plungers 21, the second plungers 22, and the coil springs 23 are assembled in a state where the main body part base materials 300 are being connected via the base part 310 and the connection parts 311, and the connection parts 311 are cut thereafter to fabricate the probes 2. According to the third modification example, the first plunger 21, the second plunger 22, and the coil spring 23 are assembled in a state where the main body part base material 300 is being regulated by the base part 310 (connection part 311), so that the plungers and the coil spring are assembled while suppressing the handling of the pipe member 24 (main body part base material 300) from becoming complicated. As a result, high work efficiency can be achieved.

Furthermore, since the plating is performed before the outer periphery punching step in the third modification example, a coating is formed uniformly and evenly over the entire main body part base material 300 (main body part 241), thereby reducing the contact resistance between the plungers and the pipe member 24. As a result, it is possible to acquire the probe 2 exhibiting fine electrical conductivity.

While the modes for embodying the present disclosure are described heretofore, the present disclosure is not limited only by the embodiment described above. Furthermore, the configuration of the probe 2 described in the embodiment is only an example, and various types of conventionally known probes can be applied. For example, it is not limited to those configured with the plungers and the spring coil as described above, the first plunger may be configured without the boss part, or other elastic members may be employed instead of the coil spring.

Furthermore, in addition to the steps described above, a cleaning step may be performed after the curling step. Moreover, in cases where the processing position changes after the curling step or the cleaning step, for example, it is possible to include a step of taking up and moving the material by a reel after the curling or the cleaning step, and releasing the material from the reel at the moved position.

As described above, the method of manufacturing a contact probe and the contact probe according to the present disclosure are preferable for efficiently fabricating the contact probes.

According to the present disclosure, it is possible to efficiently fabricate the contact probes.

All examples and conditional language recited herein are intended for pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although the embodiments have been described in detail, it should be understood that the various changes, substitutions, and alterations could be made hereto without departing from the spirit and scope of the disclosure.

What is claimed is:

1. A method of manufacturing a contact probe, the contact probe being configured to transmit a signal with a first end and a second end in a longitudinal direction coming in contact with electrodes different from each other, and including: a first plunger having the first end that comes in contact with one of the electrodes; a second plunger having the second end that comes in contact with another one of the electrodes; a coil spring provided between the first and the second plungers; and a pipe member where the first and the second plungers and the coil spring are inserted, the method comprising:

an external shape forming step of forming external shapes of a plurality of main body part base materials on a plate material, each of the plurality of main body part base materials being connected to a base part via a connection part and used for forming a main body part of the pipe member;

a protrusion forming step of forming a plurality of protrusions on each of the plurality of main body part base materials;

a curling step of forming the pipe member by bending each of the plurality of main body part base materials into a C-shape such that the protrusions protrude toward an inner side of the pipe member;

a probe assembling step of assembling the contact probe by inserting the first and the second plungers and the coil spring into the pipe member connected to the connection part; and a cutting step of cutting the pipe member from the connection part.

2. The method according to claim 1, further comprising a coining step of crushing an end part of each of the plurality of main body part base materials on a side connected to the connection part before the curling step.

3. The method according to claim 1, wherein the connection part with a smaller width on the main body part base material side is formed in the external shape forming step.

4. The method according to claim 1, further comprising a plating step of performing plating to the plate material before the external shape forming step.

* * * * *